US006870389B2

(12) United States Patent
Fattaruso

(10) Patent No.: US 6,870,389 B2
(45) Date of Patent: Mar. 22, 2005

(54) DIFFERENTIAL CIRCUIT WITH CURRENT OVERSHOOT SUPPRESSION

(75) Inventor: John W. Fattaruso, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 118 days.

(21) Appl. No.: 10/456,328

(22) Filed: Jun. 6, 2003

(65) Prior Publication Data

US 2004/0246020 A1 Dec. 9, 2004

(51) Int. Cl.$^7$ ............................................. H03K 19/003
(52) U.S. Cl. ............................. 326/26; 326/27; 326/22; 326/23; 326/126
(58) Field of Search ...................... 326/21–28, 31–34, 326/86, 91, 115, 126, 127

(56) References Cited

U.S. PATENT DOCUMENTS 4,939,393 A * 7/1990 Petty ........................... 326/78
6,483,345 B1 * 11/2002 Whittaker et al. ............ 326/62

* cited by examiner

Primary Examiner—Anh Q. Tran
(74) Attorney, Agent, or Firm—Alan K. Stewart; W. James Brady, III; Frederick J. Telecky, Jr.

(57) ABSTRACT

A differential driver circuit that suppresses current overshoot and allows current switching to proceed at near the maximum speed includes: a differential pair Q5 and Q6 having a tail current source I56; a first buffer Q3 providing a first input to the differential pair; a second buffer Q4 providing a second input to the differential pair; a first current absorbing device Q7 coupled to the tail current source I56 and having a control node SP capacitively coupled to the first buffer Q3; and a second current absorbing device Q8 coupled to the tail current source I56 and having a control node SM capacitively coupled to the second buffer Q4.

20 Claims, 3 Drawing Sheets

DIFFERENTIAL CIRCUIT WITH CURRENT OVERSHOOT SUPPRESSION

FIELD OF THE INVENTION

This invention generally relates to electronic systems and in particular it relates to a differential circuit with overshoot suppression.

BACKGROUND OF THE INVENTION

FIG. 1 shows a typical prior art differential pair used as a driver for optical network laser diodes. The circuit of FIG. 1 includes transistors Q1–Q6; resistors R0, R1, and R2; current sources I3, I4, I12, and I56; input nodes INP and INM; base nodes BP and BM; tail current node T; supply node Vcc; and output nodes OUTP and OUTM. The differential pair formed by transistors Q5 and Q6 provides a large driver current for a laser diode connected at either output node OUTM or output node OUTP. In order to switch the high currents necessary for illuminating laser diodes, the differential pair is driven by emitter follower buffer and level shift devices Q3 and Q4. An amplifier stage formed by transistors Q1 and Q2 accepts low power inputs at input nodes INP and INM. Additional level shifting is provided by resistor R0.

When switching currents in a differential pair, an overshoot typically occurs in the output where current is being switched on. (See H. M. Rein, et al., "A Versatile Si-Bipolar Driver Circuit with High Output Voltage Swing", IEEE Journal of Solid State Circuits, September 1994, page 1014.) For example, assume in FIG. 1 that transistor Q5 is initially off and that the tail current I56 is flowing through transistor Q6 to the output node OUTM. To switch the current I56 to output node OUTP, input node INM is raised and input node INP is lowered. This causes a negative going transient at the base of transistor Q6 (node BM). Since transistor Q6 had been conducting all of current I56, its $c_\pi$ (the effective small-signal capacitance between base and emitter) is quite large. The $c_\pi$ of transistor Q5, however, is quite small since transistor Q5 was initially off, giving an inherent asymmetry. The negative going transition at node BM needed to turn transistor Q6 off will couple through the large $c_\pi$ capacitance of transistor Q6 and will drive the tail node T negative, and extract a large charge out of the emitter of transistor Q5. This current transient will appear in the collector of transistor Q5 as an overshoot in addition to the tail current I56 that is being diverted to transistor Q5. The plot of FIG. 2 shows the simulated transistor Q5 collector current waveform, and the overshoot can clearly be seen on top of the switched current of 10 mA.

The current overshoot in FIG. 2 is not acceptable in an optical network laser, as well as in many other applications where high speed differential current switching is required, such as high speed digital to analog converters. Previous circuit solutions to this problem have resulted in a loss of switching speed for the differential pair, or other drawbacks.

SUMMARY OF THE INVENTION

A differential driver circuit that suppresses current overshoot and allows current switching to proceed at near the maximum speed includes: a differential pair having a tail current source; a first buffer providing a first input to the differential pair; a second buffer providing a second input to the differential pair; a first current absorbing device coupled to the tail current source and having a control node capacitively coupled to the first buffer; and a second current absorbing device coupled to the tail current source and having a control node capacitively coupled to the second buffer.

DETAILED DESCRIPTION OF PREFERRED EMBODIMENTS

Figure 3:
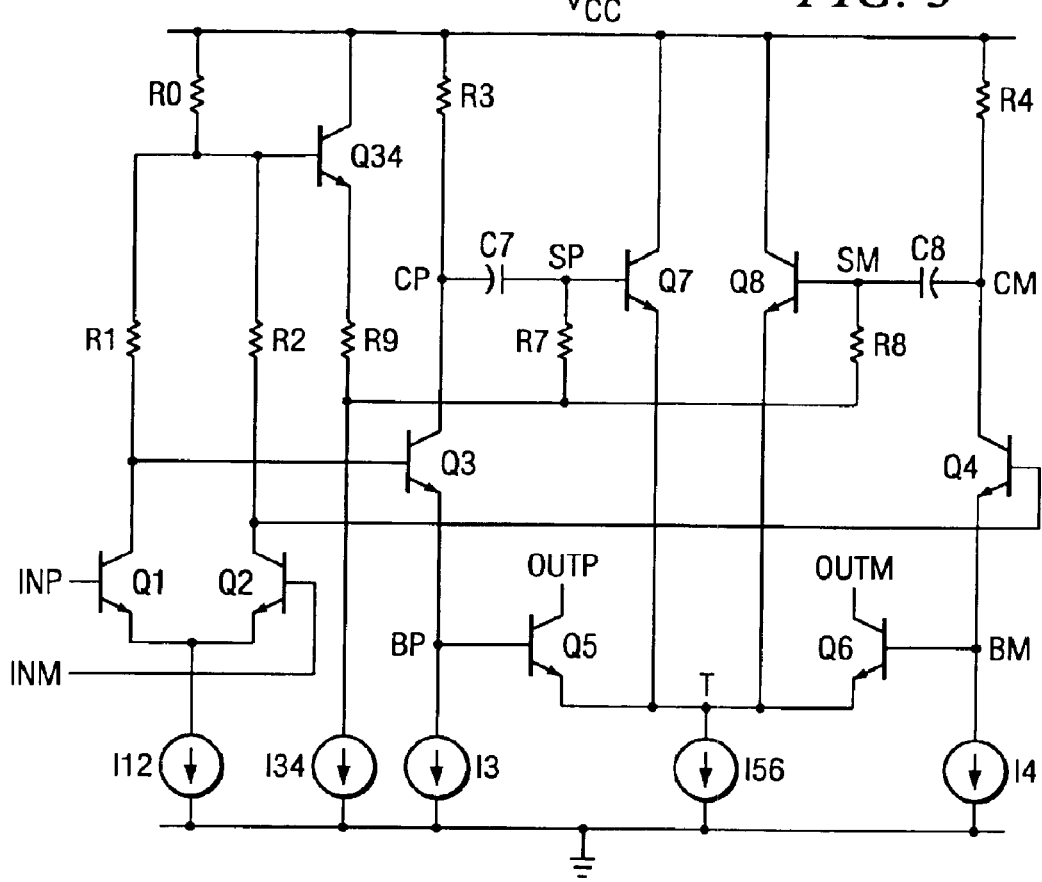
FIG. 3 is a schematic diagram of a preferred embodiment differential circuit with current overshoot suppression.

A preferred embodiment differential circuit that suppresses current overshoot and allows current switching to proceed at near the maximum speed is shown in FIG. 3. The circuit of FIG. 3 includes the components of the prior art circuit of FIG. 1 plus the following additional components: transistors Q7 and Q8 (current absorbing devices); capacitors C7 and C8; transistor Q34; resistors R3, R4, R7, R8, and R9; current source I34; and nodes CP, CM, SP, and SM.

Figure 1:
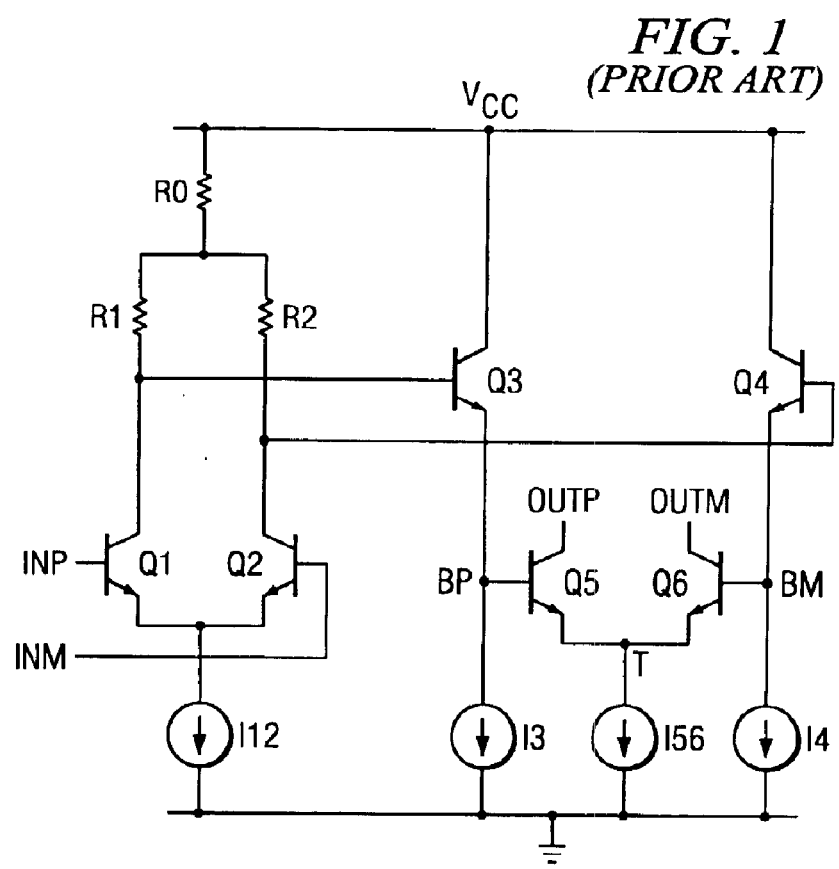
FIG. 1 is a schematic diagram of a prior art differential circuit.

The active signal path for the preferred embodiment driver remains the same as the circuit of FIG. 1, with the amplifier formed by transistors Q1 and Q2 driving emitter followers Q3 and Q4, which drive the output differential pair formed by transistors Q5 and Q6. However, two additional bipolar devices Q7 and Q8 have been added, and act to absorb the overshoot charge and bypass the output terminals OUTP and OUTM. The bases of devices Q7 and Q8 are biased through resistors R7 and R8 to hold them in the cutoff region in all but the transition times of the differential pair. This is accomplished by including an emitter follower Q34, which replicates the level shift of emitter followers Q3 and Q4. Since the base of device Q34 is tied to the top of resistors R1 and R2, and thus to the maximum voltage that can ever be applied to the bases of transistors Q3 and Q4, the emitter of device Q34 would be at the maximum voltage that the bases of transistors Q5 and Q6 would ever experience. Current I34 flowing through resistor R9 provides an additional 100–200 millivolts of negative level shift, and the resulting voltage biases the bases of devices Q7 and Q8 through resistors R7 and R8. Since the emitters of transistors Q5, Q6, Q7, and Q8 are all tied together, the voltage at the tail node T is determined by the device with the highest base voltage. Therefore, transistors Q7 and Q8 must be quiescently off since their base voltages are 100–200 mV lower than the higher of the bases of transistors Q5 and Q6.

However, the rest of the circuitry is arranged to briefly turn on transistor Q7 or Q8 during the transition time of the differential pair of transistors Q5 and Q6. The bases of transistors Q7 and Q8 are also capacitively coupled to nodes CP and CM through capacitors C7 and C8, respectively. In the above discussion of the overshoot mechanism in the prior art circuit of FIG. 1, the overshoot that occurs, for example, when turning on transistor Q5 and turning off transistor Q6 is due to the large charge that is stored on the capacitance $c_\pi$ of transistor Q6. This charge tends to hold node BM high during the transient when transistor Q6 is being driven off. The only current that can discharge this capacitance is current I4, and this discharge current, routed through the emitter of transistor Q5, causes the overshoot. In this transient interval, emitter follower device Q4 actually comes close to turning off, as its base voltage has been driven low by the input amplifier of transistors Q1 and Q2, and the node BM cannot discharge quickly. Therefore, by monitoring the collector current of the emitter follower Q4 with a resistive load, a positive going signal can be found that coincides with the transition interval during which transistor Q6 is turning off and the current overshoot is occurring. This positive transient at node CM is coupled to the base of suppression device Q8 through capacitor C8, and acts to briefly turn device Q8 on to absorb the excess charge drawn out of the tail node T, and bypassing it to the supply node VCC so that it does not disturb the output current at node OUTM. Similarly, suppression device Q7 will act to absorb the overshoot charge when transistor Q6 is being turned back on in the next data cycle. The following simulated waveform plots illustrate this process.

Figure 4:
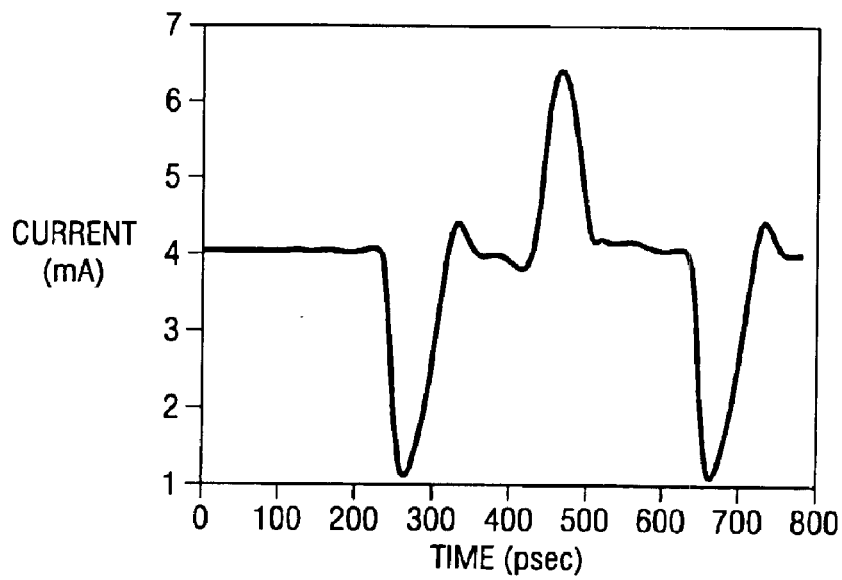
FIG. 4 is a collector current waveform for an emitter follower in the preferred embodiment circuit of FIG. 3.

FIG. 4 shows the collector current in transistor Q4 as a function of time. The emitter follower is nominally biased at 4 mA with current source I4. On the data edges where transistor Q6 is being turned off the transient drop in collector current to almost 1 mA is clearly seen. Almost 3 mA of current I4 is diverted to discharge the capacitance $c_\pi$ of transistor Q6. (It is also clear on the opposite edge that additional transient collector current is drawn to recharge capacitance $c_\pi$). The drop in collector current is sensed by load resistor R4 and the resulting positive going transient voltage is fed to the base of transistor Q8 through capacitor C8 as shown in FIG. 5.

Figure 5:
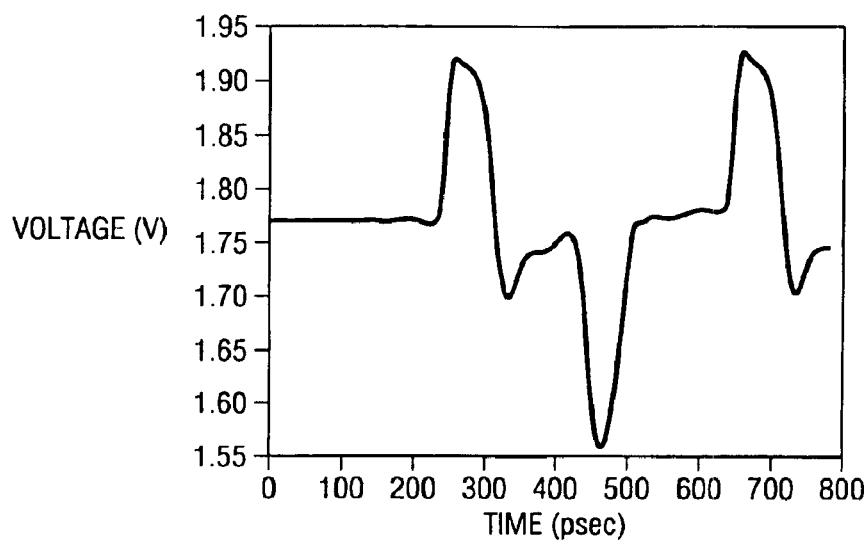
FIG. 5 is a plot of a transistor base voltage for a current suppression transistor in the preferred embodiment circuit of FIG. 3.

The plot in FIG. 5 shows the positive transient in the base voltage of transistor Q8 at node SM on the edges where transistor Q6 turns off. This pulse will overcome the negative bias of the base-emitter voltage fed through resistor R8 and briefly turn on transistor Q8. This conduction will extract charge from the tail node T and bypass it to the supply node VCC at the same instant that excess charge is being introduced to node T by the discharging of the capacitance $c_\pi$ of transistor Q6, thus suppressing the overshoot. (The negative going pulse at node SM on the opposite data edge will only drive transistor Q8 deeper into cutoff.)

Figure 2:
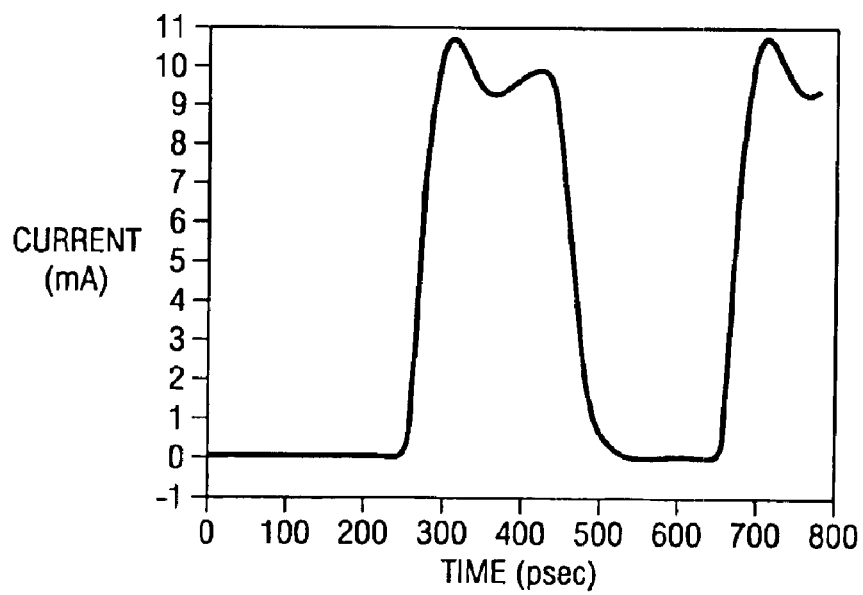
FIG. 2 is a collector current waveform for the prior art circuit of FIG. 1.
Figure 6:
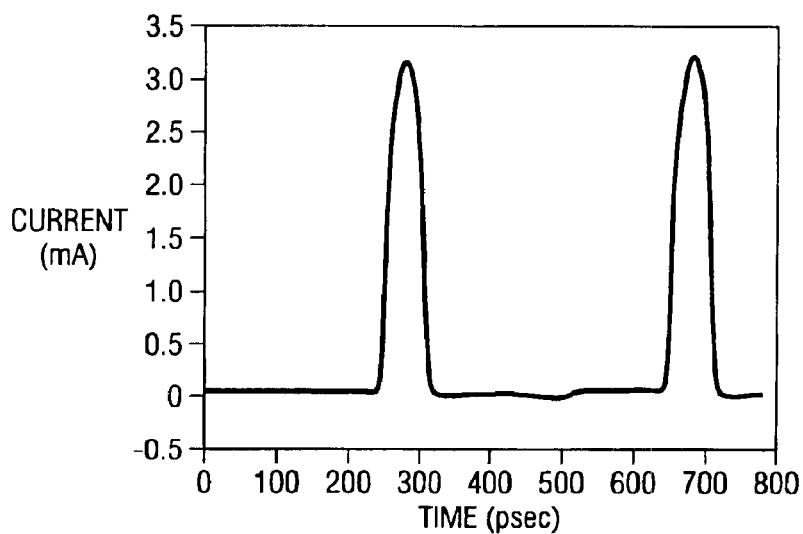
FIG. 6 is a collector current waveform for a current suppression transistor in the preferred embodiment circuit of FIG. 3.

The pulse of collector current in transistor Q8 that suppresses the overshoot can be seen in FIG. 6. At its peak this pulse will cancel 3 mA of the overshoot on the edge of the collector of transistor Q5 plotted in FIG. 2.

Figure 7:
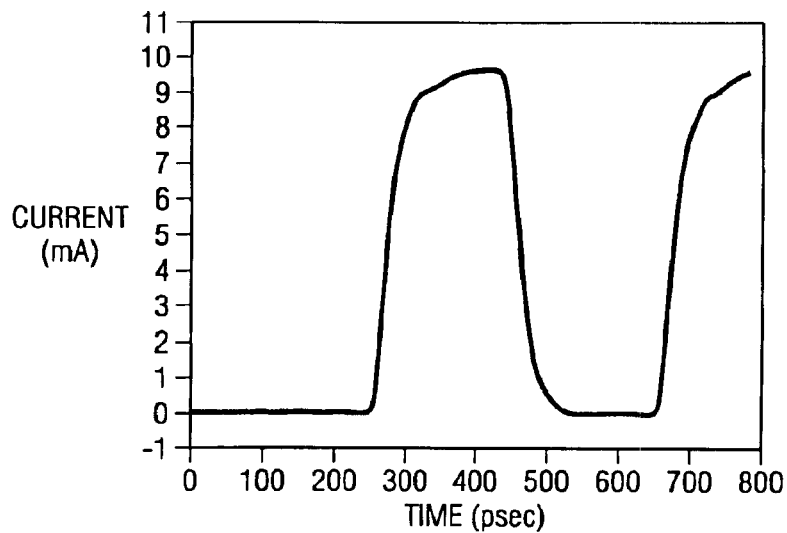
FIG. 7 is a collector current waveform for a differential pair transistor in the preferred embodiment circuit of FIG. 3.

The resulting collector current of transistor Q5 in the preferred embodiment circuit is shown in FIG. 7. Note that the collector current of transistor Q5 now exhibits an edge without overshoot, and a more gradual approach to its peak value. This is the preferred waveform for a laser driver circuit, but other applications may also be served with more or less overshoot suppression. The amount of suppression may be chosen by adjusting the value of resistor R9 or the values of resistors R3 and R4. It is also clear from FIG. 3 that the overshoot in the collector current of transistor Q6 when transistor Q5 turns off is suppressed by a symmetrical operation of transistor Q7.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. For example, the transistors of the preferred embodiment can be MOSFETs instead of bipolar transistors. It is therefore intended that the appended claims encompass any such modifications or embodiments.

What is claimed is:

1. A differential driver circuit comprising:

a differential pair having a tail current source;

a first buffer providing a first input to the differential pair;

a second buffer providing a second input to the differential pair;

a first current absorbing device coupled to the tail current source and having a control node capacitively coupled to the first buffer; and a second current absorbing device coupled to the tail current source and having a control node capacitively coupled to the second buffer.

2. The circuit of claim 1 wherein the first current absorbing device is a transistor, and the second current absorbing device is a transistor.

3. The circuit of claim 1 wherein the first buffer comprises a first transistor having a first end coupled to the first input of the differential pair, and the second buffer comprises a second transistor having a first end coupled to the second input of the differential pair.

4. The circuit of claim 3 wherein the control node of the first current absorbing device is capacitively coupled to a second end of the first transistor, and the control node of the second current absorbing device is capacitively coupled to a second end of the second transistor.

5. The circuit of claim 4 further comprising a first resistance coupled between the second end of the first transistor and a supply node, and a second resistance coupled between the second end of the second transistor and the supply node.

6. The circuit of claim 1 further comprising a bias circuit coupled to the control node of the first current absorbing device and to the control node of the second current absorbing device.

7. The circuit of claim 6 wherein the bias circuit comprises a transistor.

8. The circuit of claim 7 wherein the bias circuit further comprises a first resistance coupled between the transistor and the control node of the first current absorbing device, and a second resistance coupled between the transistor and the control node of the second current absorbing device.

9. The circuit of claim 1 further comprising an amplifier stage having a first output coupled to an input of the first buffer, and a second output coupled to an input of the second buffer.

10. The circuit of claim 9 further comprising a bias circuit having an input coupled to the amplifier stage, a first output coupled to the control node of the first current absorbing device, and a second output coupled to the control node of the second current absorbing device.

11. The circuit of claim 9 wherein the amplifier stage comprises a differential pair.

12. The circuit of claim 11 wherein the amplifier stage further comprises a first resistance in the first branch of the differential pair, a second resistance in the second branch of the differential pair, and a third resistance having a first end coupled to the first and second resistances and a second end coupled to a supply node.

13. The circuit of claim 12 further comprising a transistor coupled to the control node of the first current absorbing device and to the control node of the second current absorbing device, and having a control node coupled to the first end of the third resistance.

14. The circuit of claim 13 further comprising a fourth resistance coupled between the transistor and the control node of the first current absorbing device, and a fifth resistance coupled between the transistor and the control node of the second current absorbing device.

15. A differential driver circuit comprising:
    an input amplifier stage;
    a first buffer having an input coupled to a first output of the amplifier stage;
    a second buffer having an input coupled to a second output of the amplifier stage;
    a differential pair having a tail current source, a first input of the differential pair is coupled to an output of the first buffer, and a second input of the differential pair is coupled to an output of the second buffer;
    a first current absorbing device coupled to the tail current source and having a control node capacitively coupled to the first buffer;
    a second current absorbing device coupled to the tail current source and having a control node capacitively coupled to the second buffer; and
    a bias circuit having an input coupled to the amplifier stage, a first output coupled to the control node of the first current absorbing device, and a second output coupled to the control node of the second current absorbing device.

16. The circuit of claim 15 wherein the first current absorbing device comprises a transistor, and the second current absorbing device comprises a transistor.

17. The circuit of claim 15 wherein the input amplifier comprises a differential pair.

18. The circuit of claim 15 wherein the first buffer comprises a transistor, and the second buffer comprises a transistor.

19. The circuit of claim 15 wherein the bias circuit comprises a transistor.

20. A method for suppressing current overshoot in a differential pair comprising:
    sensing a transition of an input signal of the differential pair; and
    forcing overshoot current to bypass a branch of the differential pair in response to the transition.

* * * * *